United States Patent
Chen et al.

(10) Patent No.: US 11,776,911 B2
(45) Date of Patent: Oct. 3, 2023

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Hung-Ming Chen, Hsinchu County (TW); Yu-Chang Lin, Hsinchu (TW); Chung-Ting Li, Hsinchu County (TW); Jen-Hsiang Lu, Taipei (TW); Hou-Ju Li, Hsinchu (TW); Chih-Pin Tsao, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/330,834

(22) Filed: May 26, 2021

(65) Prior Publication Data

US 2021/0280516 A1    Sep. 9, 2021

Related U.S. Application Data

(62) Division of application No. 15/489,905, filed on Apr. 18, 2017, now Pat. No. 11,024,582.

(51) Int. Cl.
| | |
|---|---|
| *H01L 29/66* | (2006.01) |
| *H01L 29/78* | (2006.01) |
| *H01L 23/535* | (2006.01) |
| *H01L 21/768* | (2006.01) |
| *H01L 29/417* | (2006.01) |

(52) U.S. Cl.
CPC ...... *H01L 23/535* (2013.01); *H01L 21/76841* (2013.01); *H01L 21/76897* (2013.01); *H01L 29/41791* (2013.01); *H01L 29/66545* (2013.01); *H01L 29/66795* (2013.01); *H01L 29/785* (2013.01); *H01L 29/7848* (2013.01)

(58) Field of Classification Search
CPC ......... H01L 21/76841; H01L 21/76897; H01L 23/535; H01L 29/41791; H01L 29/66545; H01L 29/66795; H01L 29/7848; H01L 29/785
See application file for complete search history.

(56) References Cited

U.S. PATENT DOCUMENTS

| | | | |
|---|---|---|---|
| 6,949,481 B1 * | 9/2005 | Halliyal | H01L 21/02326 257/E21.279 |
| 2004/0063260 A1 * | 4/2004 | Bu | H01L 29/6656 438/197 |
| 2004/0188774 A1 | 9/2004 | Takeda et al. | |
| 2005/0164461 A1 * | 7/2005 | Chen | H01L 29/665 438/303 |
| 2006/0019455 A1 * | 1/2006 | Bu | H01L 29/6653 438/303 |

(Continued)

*Primary Examiner* — Meiya Li

(74) *Attorney, Agent, or Firm* — Birch, Stewart, Kolasch & Birch, LLP

(57) ABSTRACT

A method includes forming a gate structure on a substrate; forming a gate spacer on a sidewall of the gate structure; forming a carbon-containing layer on the gate spacer; diffusing carbon from the carbon-containing layer into a portion of the substrate below the gate spacer; forming a recess in the substrate on one side of the gate spacer opposite to the gate structure; and forming an epitaxy feature in the recess of the substrate.

20 Claims, 12 Drawing Sheets

(56) References Cited

U.S. PATENT DOCUMENTS

| | | | |
|---|---|---|---|
| 2012/0068268 A1* | 3/2012 | Hsiao | H01L 29/6653 |
| | | | 257/E27.06 |
| 2014/0015104 A1* | 1/2014 | Su | H01L 29/66545 |
| | | | 438/549 |
| 2014/0264623 A1 | 9/2014 | Nandakumar | |
| 2014/0291759 A1 | 10/2014 | Zhao | |
| 2017/0084722 A1 | 3/2017 | Lu et al. | |

* cited by examiner

US 11,776,911 B2

SEMICONDUCTOR DEVICE AND MANUFACTURING METHOD THEREOF

The present application is a Divisional application of U.S. application Ser. No. 15/489,905, filed on Apr. 18, 2017, now U.S. Pat. No. 11,024,582, issued on Jun. 1, 2021, which is herein incorporated by reference.

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' on a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials, and strained source drain (SSD) has been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
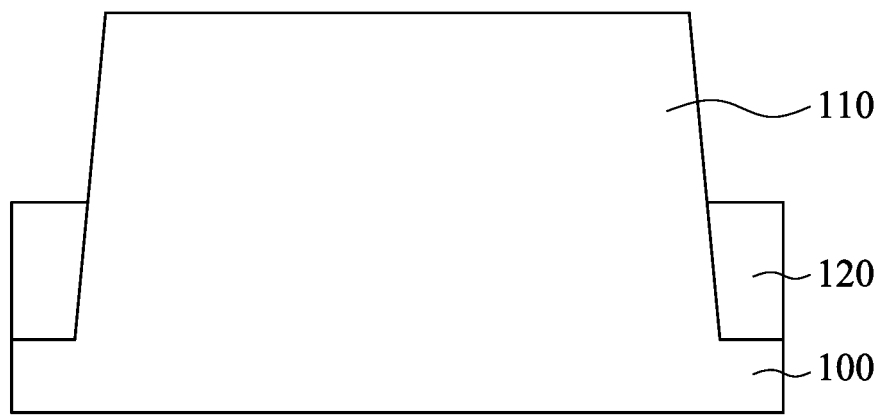
FIG. 1 to FIG. 12 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

FIG. 1 to FIG. 12 are cross-sectional views of a method for manufacturing a semiconductor device at various stages in accordance with some embodiments of the present disclosure. Reference is made to FIG. 1. A semiconductor fin 110 is formed on the substrate 100 and protrudes from the substrate 100. In some embodiments, the substrate 100 includes silicon. Alternatively, the substrate 100 may include germanium, silicon germanium, gallium arsenide or other appropriate semiconductor materials. Also alternatively, the substrate 100 may include an epitaxial layer. For example, the substrate 100 may have an epitaxial layer overlying a bulk semiconductor. Further, the substrate 100 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 100 may include a semiconductor-on-insulator (SOI) structure. Also alternatively, the substrate 100 may include a buried dielectric layer, such as a buried oxide (BOX) layer, such as that formed by separation by implantation of oxygen (SIMOX) technology, wafer bonding, SEG, or other appropriate method.

In some embodiments, the semiconductor fin 110 includes silicon. The semiconductor fin 110 is formed on the substrate 100. The semiconductor fin 110 may be formed, for example, by patterning and etching the substrate 100 using photolithography techniques. In some embodiments, a layer of photoresist material (not shown) is sequentially deposited over the substrate 100. The layer of photoresist material is irradiated (exposed) in accordance with a desired pattern (the semiconductor fin 110 in this case) and developed to remove portions of the photoresist material. The remaining photoresist material protects the underlying material from subsequent processing steps, such as etching. It is noted that other masks, such as an oxide or silicon nitride mask, may also be used in the etching process.

An isolation dielectric 120 is formed to fill trenches between the semiconductor fins 110 as shallow trench isolation (STI). The isolation dielectric 120 may include any suitable dielectric material, such as silicon oxide, silicon nitride, silicon oxynitride, fluoride-doped silicate glass (FSG), or other low-K dielectric materials. The method of forming the isolation dielectric 120 may include depositing an isolation dielectric 120 on the substrate 100 to cover the semiconductor fin 110, optionally performing a planarization process to remove the excess isolation dielectric 120 outside the trenches, and then performing an etching process on the isolation dielectric 120 until upper portions of the semiconductor fins 110 are exposed. In some embodiments, the isolation dielectric 120 may be recessed by a wet etching process or a dry etching process.

Figure 2:
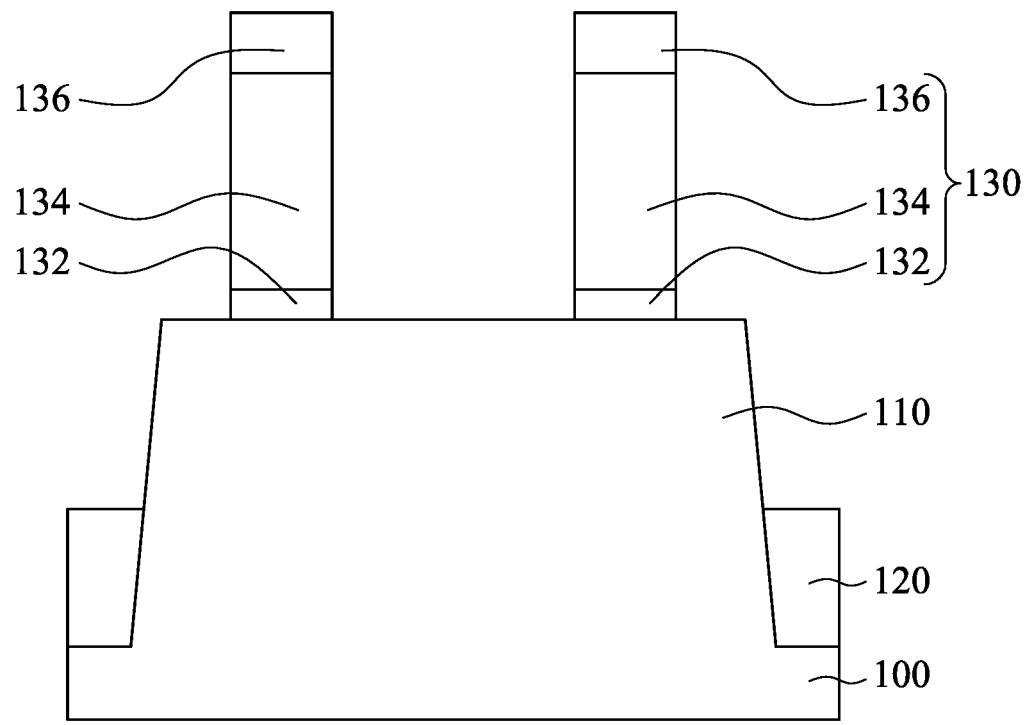

Reference is made to FIG. 2. Gate structures 130 are formed on portions of the semiconductor fin 110 at an interval and expose other portions of the semiconductor fin 110. The gate structures 130 have longitudinal axes that are substantially perpendicular to a longitudinal axis of the semiconductor fin 110. In some embodiments, the gate structures 130 can serve as dummy gate structures and at least portions thereof will be replaced with a replacement gate structure using a "gate-last" or replacement-gate process. For example, portions of the dummy gate structures 130 may be replaced later by metal gate electrodes (MG) after high temperature thermal processes, such as thermal annealing for source/drain activation during the sources/drains formation. In other embodiments, the gate structures 130 are active gates and are formed in a "gate-first process" and will not be replaced.

The gate structures 130 can be formed by deposition and patterning. In some embodiments, the gate structure 130 includes a gate dielectric layer 132 and a dummy gate electrode 134 with an overlaying mask layer 136. The gate dielectric layer 132 is blanket deposited on the substrate 100 by a suitable technique, such as thermal oxidation, chemical vapor deposition (CVD), physical vapor deposition (PVD), atomic layer deposition (ALD), sputtering, other suitable processes, or combinations thereof. In some embodiments, the gate dielectric layer 132 may include, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In some embodiments, the gate dielectric layer 132 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 132 may have a multilayer structure such as one layer of silicon oxide (e.g., interfacial layer) and another layer of high-k material.

The dummy gate electrode 134 is deposited on the gate dielectric layer 132 by a suitable technique, such as thermal oxidation, chemical vapor deposition (CVD), physical vapor deposition (PVD), atomic layer deposition (ALD), sputtering, other suitable processes, or combinations thereof. In some embodiments, the dummy gate electrode 134 may include polycrystalline-silicon (poly-Si), poly-crystalline silicon-germanium (poly-SiGe), metallic nitrides, metallic silicides, metallic oxides, or metals. In some embodiments, the dummy gate electrode 134 may include a metal-containing material such as TiN, TaN, TaC, Co, Ru, Al, combinations thereof, or multi-layers thereof.

The mask layer 136, such as photoresists, hard masks, combinations thereof, or multi-layers thereof, may be formed over the dummy gate electrode 134. Then, the mask layer 136 is patterned by a lithography process and an etching process, thereby forming openings in the mask layer 136, exposing the underlying dummy gate electrode 134 within the openings. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). Another etching process is applied to the dummy gate electrode 134 and the gate dielectric layer 132 through the openings of the mask layer 136, thereby forming the gate structure 130 straddling portions of the semiconductor fin 110 as shown in FIG. 2.

Figure 3:
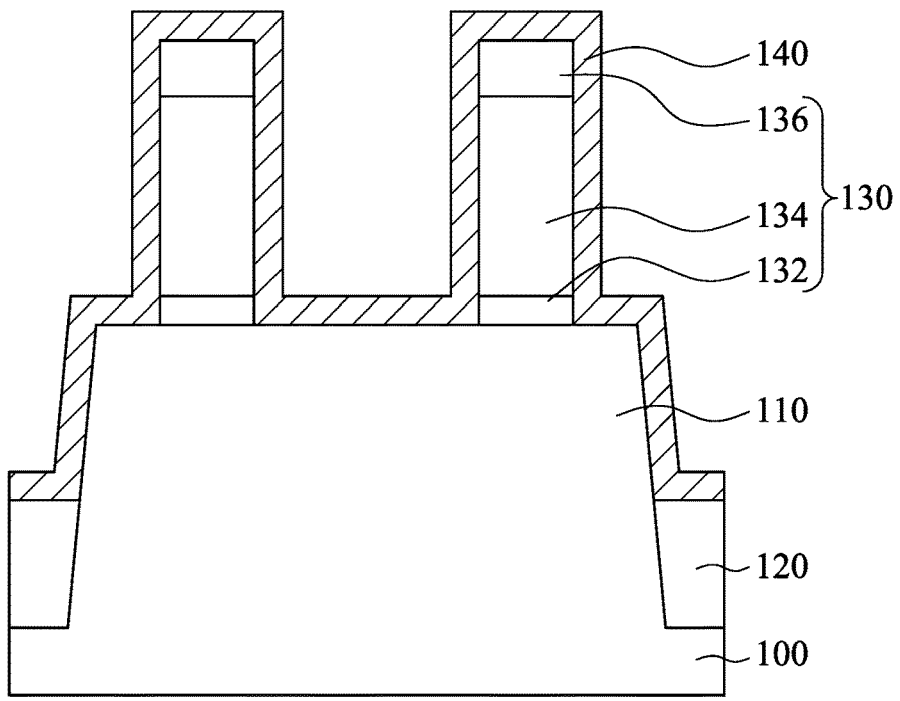

Reference is made to FIG. 3. A gate spacer layer 140 is conformally formed over at least the semiconductor fin 110 and the dummy gate structure 130. More particular, portions of the gate spacer layer 140 are located on sidewalls of the dummy gate structure 130. In some embodiments, the gate spacer layer 140 may include silicon oxide, silicon nitride, silicon oxynitride, silicon carbide, silicon carbonitride, silicon oxycarbonitride, silicon oxycarbide or other suitable material. The gate spacer layer 140 may include a single layer or multilayer structure. To form the gate spacer layer 140, a blanket layer may be formed on the substrate 100 by CVD, PVD, ALD, or other suitable technique.

In some embodiments, after forming the gate spacer layer 140 on portions of the semiconductor fin 110, ion implant may be performed to the semiconductor fin 110, so as to form lightly doped drain (LDD) regions (not shown) in the semiconductor fin 110. In alternative embodiments, the LDD regions may be formed immediately after dummy gate structures are formed.

Figure 4:
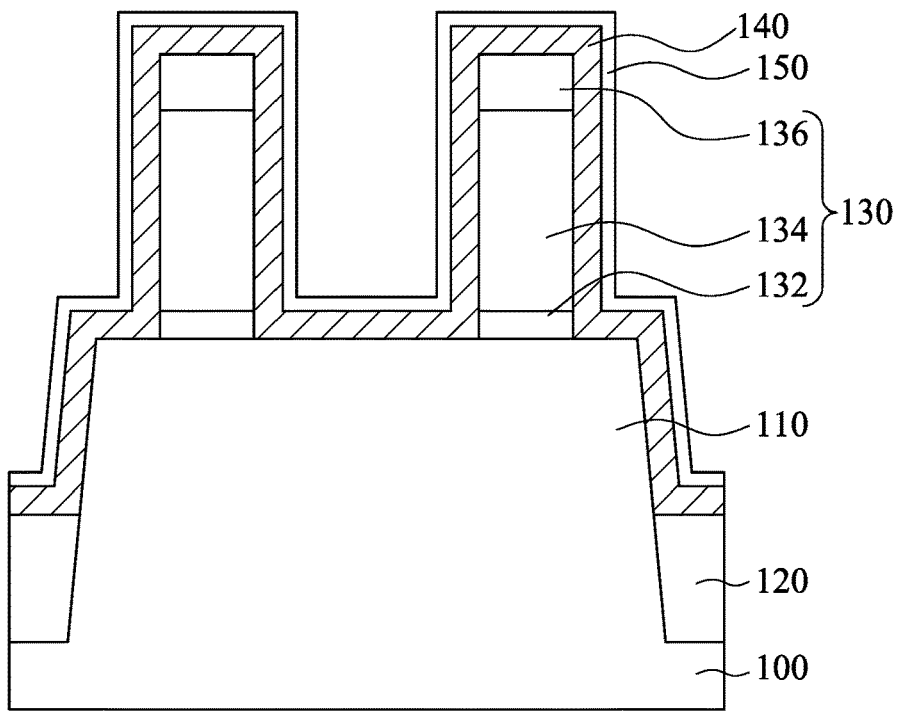

Reference is made to FIG. 4. A dopant-rich layer 150 is conformally formed on the gate spacer layer 140 over the substrate 100. In some embodiments, the dopant-rich layer 150 may include a dopant, such as, carbon. In some embodiments, the dopant-rich layer 150 is formed, by a suitable technique, such as plasma-assisted process or plasma doping (PLAD). In some embodiments, the pressure of the plasma doping process may be in a range from about 5 mTorr to about 50 mTorr. The substrate may be or may not be biased. If the substrate is biased, the dopant depth of the dopant-rich layer 150 can be increased. The dopant-rich layer 150 formed by plasma doping may have a great uniformity at three dimensional structures, since the plasma ions in the plasma sheath may move in different directions, rather just being directed toward the substrate. In alternative embodiments, the dopant-rich layer 150 may be performed by ion beams (ion implantation, or beam line), chemical vapor deposition (CVD), physical vapor deposition (PVD), atomic layer deposition (ALD), sputtering, other suitable processes, or combinations thereof.

Figure 5:
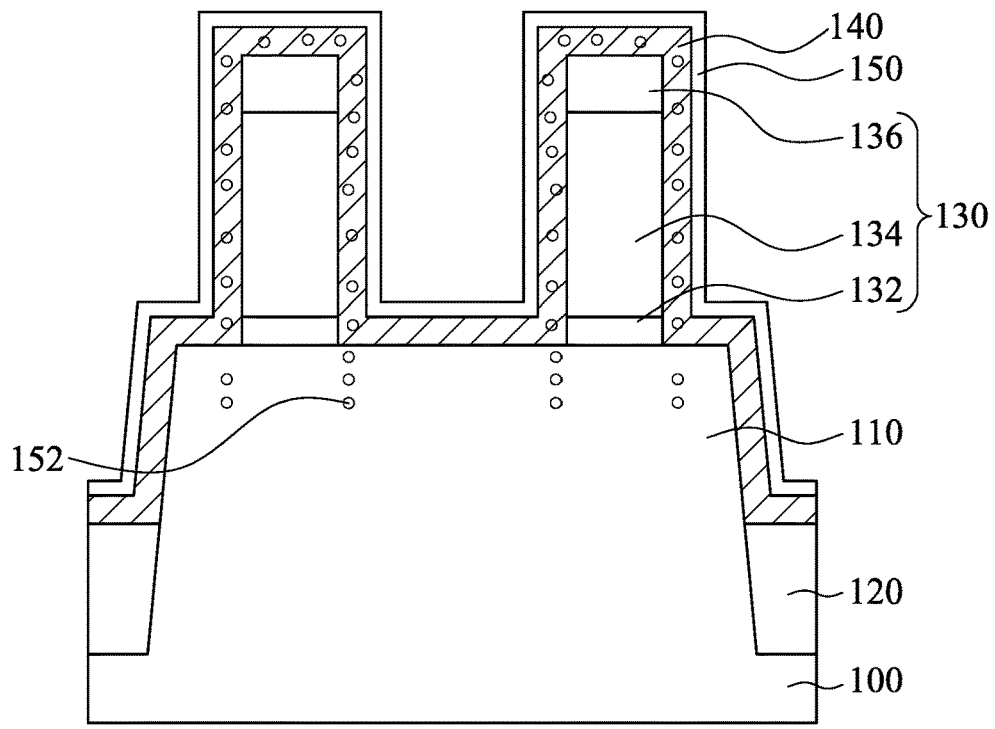

Reference is made to FIG. 5. In some embodiments, an annealing process is performed. In some embodiments, the annealing process may be performed to drive (or diffuse) the dopants from the dopant-rich layer 150 into the gate spacer layer 140 and into a portion of the substrate 100. In some embodiments, the annealing process may be performed to activate the dopants of the LDD region and the dopants of the dopant-rich layer 150. The annealing may utilize rapid thermal annealing (RTA), spike annealing, millisecond annealing, and/or laser annealing. In some embodiments where the dopant-rich layer 150 includes a carbon dopant, the carbon dopant may be diffused into the semiconductor fin 110 and the gate spacer layer 140. In some cases, the carbon dopants in the semiconductor fin 110 can act as carbon-containing diffusion barriers 152. This is due to the fact that carbon is able to retard or prevent out-diffusion of dopants, such as phosphorus or boron, from subsequently formed epitaxy structures, which will be discussed below. In particular, carbon has higher diffusion-retarding ability to phosphorus than that of semiconductor materials, such as silicon, and hence carbon-containing diffusion barriers 152 in the semiconductor fin 110 may be advantageous to prevent out-diffusion of phosphorus from subsequently formed epitaxy structures.

In some embodiments, carbon dopants are also present in the gate spacer layer 140 after the diffusion of carbon dopants. In other words, the gate spacer layer 140 is doped with the carbon-containing diffusion barriers 152 as well. Stated differently, the gate spacer layer 140 is carbon-doped. Thereafter, in FIG. 6, the dopant-rich layer 150 is removed using, for example, dry etching, wet etching or a combination thereof.

Figure 6:
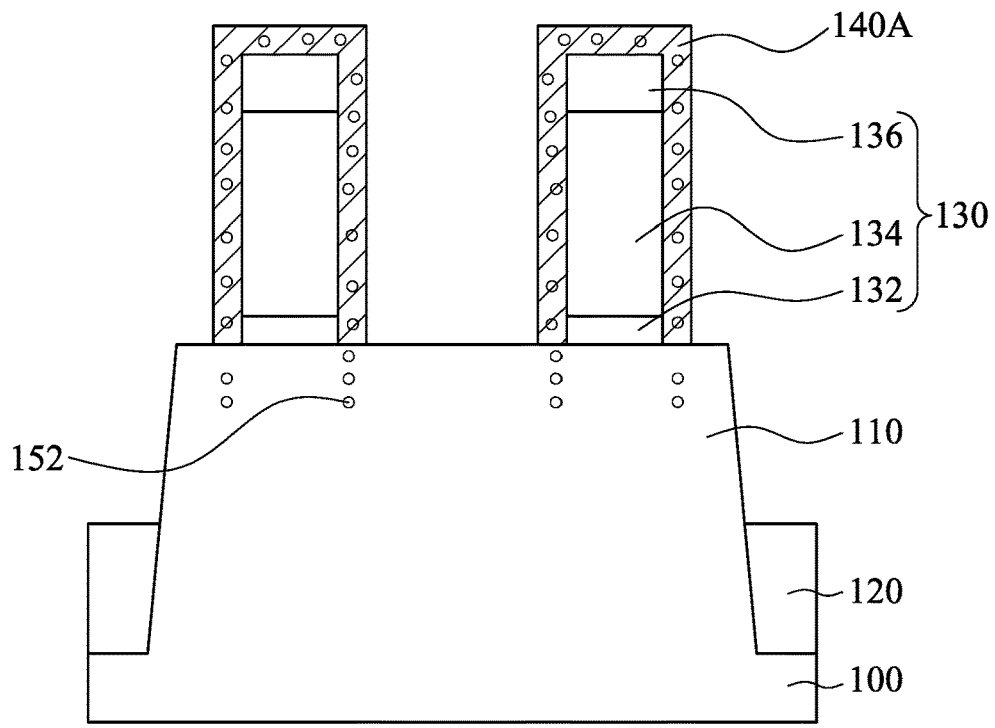

Reference is made to FIG. 6. Portions of the gate spacer layer 140 are removed, and remaining portions of the gate spacer layer 140 can serve as gate spacers 140A located on opposite sides of the dummy gate structures 130. The removal process may be, for example, an etching process, such as an anisotropic etching process. In some embodiments, the removal process may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing.

Figure 7:
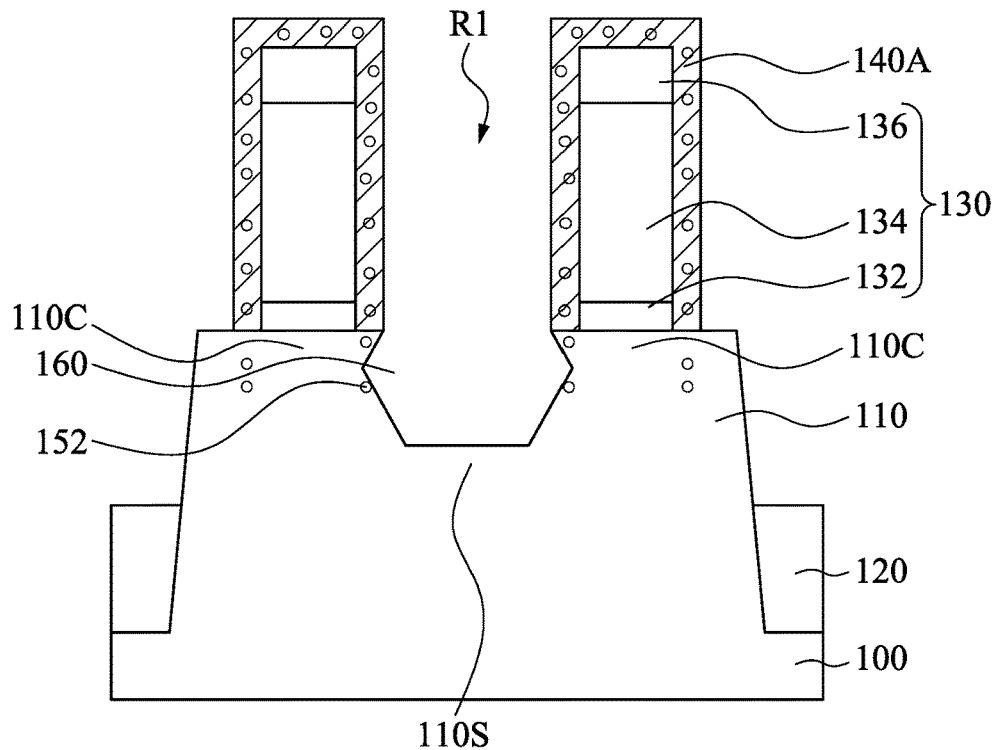

Reference is made to FIG. 7. A portion of the semiconductor fin 110 exposed by the dummy gate structures 130 and the gate spacers 140A is removed (or recessed) to form a recess R1 in the substrate 100. More particularly, the recess R1 is formed on the semiconductor fin 110 and between the gate spacers 140A. A remaining portion of the semiconductor fin 110 has at least one source/drain portion 110S and channel portions (or called channel regions) 110C. The channel portions 110C underlie respective dummy gate structures 130, and the source/drain portion 110S is exposed by the dummy gate structures 130 and the gate spacers 140A. In some embodiments, the recess R1 is formed proximate the channel portions 110C by using an etching process that includes an anisotropic etching, so that a portion of the semiconductor fin 110 is removed from beneath a bottom surface of the gate spacer 140A. In other words, the etching process is selected to achieve a "proximity push" or a close proximity to the channel portions 110C. In some embodiments where the gate spacers 140A are thicker than acceptable, the recess R1 can be formed to have a substantially diamond-shaped profile. As a result, a distance from the recess R1 to the channel portion 110C can fall into an acceptable range. That is, a sidewall of the recess R1 extends towards the channel portion 110C underneath the gate spacer 140A. Alternatively, the recess R1 may include other shapes, such as rounded or elliptical. In some embodiments, where the gate spacers 140A have acceptable thicknesses, the recesses R1 can be formed to have a substantially U-shaped profile (not shown), and sidewalls of the recess R1 can be substantially aligned with the edges (or outer boundaries) of the gate spacers 140A.

Figure 8:
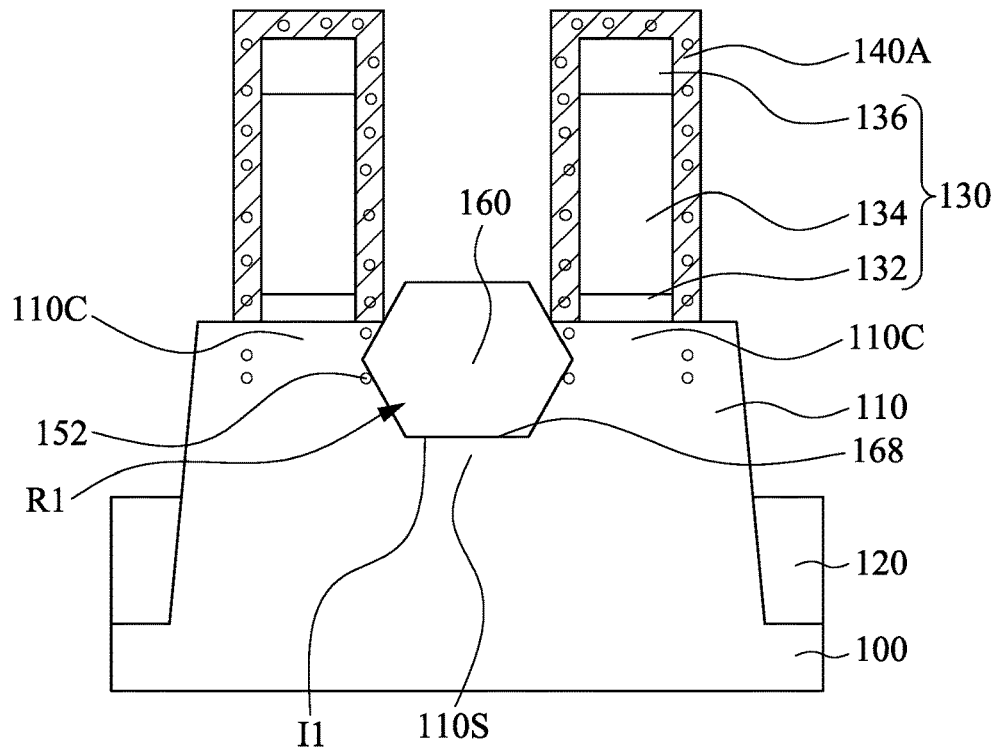

In some embodiments, Reference is made to FIG. 8. An epitaxy structure 160 is formed within the recess R1 and on the source/drain portion 110S of the semiconductor fin 110. Inner edges of the epitaxy structure 160 may substantially epitaxial growth along sidewalls of the recess R1, and the gate spacer 140A is over a portion of the epitaxy structure 160. The epitaxy structure 160 may be disposed proximate the channel portions 110C of the semiconductor fin 110, so the epitaxy structure 160 on the source/drain portion 110S may have a desired width to reduce a contact resistance between the epitaxy structure 160 and subsequently formed source/drain contact plugs. In some embodiments, the epitaxy structure 160 may be formed using one or more epitaxy or epitaxial (epi) processes, such that Si features, SiGe features, SiP features, and/or other suitable features can be formed in a crystalline state on the source/drain portion 110S of the semiconductor fin 110. In some embodiments, a lattice constant of the epitaxy structure 160 is different from a lattice constant of the semiconductor fin 110, so that the channels of the semiconductor fin 110 can be strained or stressed by the epitaxy structure 160 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the source/drain portion 110S of the semiconductor fin 110 (e.g., silicon). Thus, a strained channel can be achieved to increase carrier mobility and enhance device performance. The epitaxy structure 160 may be in-situ doped. The doping species include P-type dopants, such as boron or BF2; or N-type dopants, such as phosphorus or arsenic; and/or other suitable dopants including combinations thereof. If the epitaxy structure 160 is not in-situ doped, a second implantation process (i.e., a junction implant process) is performed to dope the epitaxy structure 160. In some embodiments where the epitaxy structure 160 includes SiP, the epitaxy structure 160 can be referred to as phosphorus-containing source/drain feature or phosphorus-containing epitaxy feature. One or more annealing processes may be performed to activate the epitaxy structure 160. The annealing processes include rapid thermal annealing (RTA) and/or laser annealing processes.

The carbon-containing diffusion barriers 152 underlying the gate spacer 140A are present between the epitaxy structure 160 and the channel portion 110C. State differently, the carbon-containing diffusion barriers 152 interpose the epitaxy structure 160 and the channel portion 110C. Since carbon-containing diffusion barriers 152 can retard the out-diffusion of phosphorus from the epitaxy structure 160 into the channel portions 110C, so the phosphorus of the epitaxy structure 160 may be well confined in the recess R1. As a result, forming the carbon-containing diffusion barriers 152 between the channel portion 110C and the epitaxy structure 160 are advantageous to reduce a capacitance formed between the epitaxy structure 160 and the channel portion 110C. Moreover, inhibition of the phosphorus diffusion from the epitaxy structure 160 into the channel portions 110C can also reduce a short channel effect, thus improving a performance of the semiconductor device and having favorable DIBL (drain-induced barrier lowering) characteristics.

In some embodiments, the carbon-containing diffusion barriers 152 are absent between a bottom surface 168 of the epitaxy structure 160 and the substrate 100. That is, a bottom surface of the recess R1 is free from carbon dopant. In further embodiments, the bottom surface 168 of the epitaxy structure 160 forms an interface I1 with the substrate 100. In some embodiments, after formation of carbon-containing diffusion barriers 152 that have an expected diffusion-retarding ability to phosphorus in the epitaxy structure 160, a ratio of the carbon to silicon at a sidewall of the semiconductor fin 110 is greater than 0.08. In some embodiments, after formation of carbon-containing diffusion barriers 152 that have an expected diffusion-retarding ability to phosphorus in the epitaxy structure 160, a carbon concentration at a top of the semiconductor fin 110 is greater than about 4E20 cm$^{-3}$.

Figure 9:
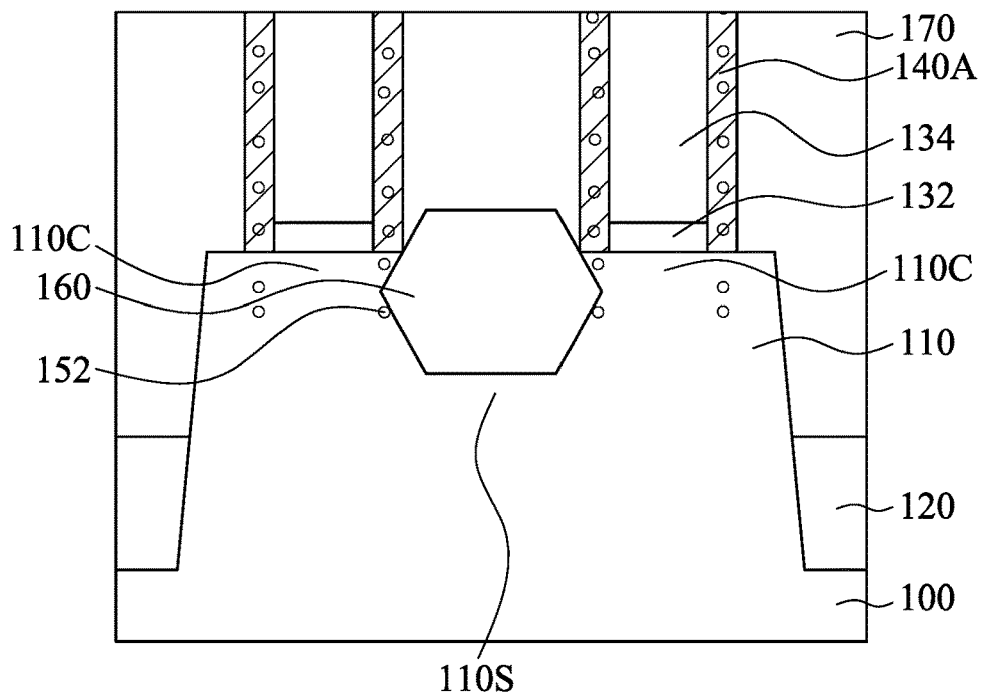

Reference is made to FIG. 9. Thereafter, an interlayer dielectric (ILD) layer 170 is formed at outer sides of the gate spacers 140A on the substrate 100. The ILD layer 170 includes silicon oxide, silicon nitride, silicon oxynitride, silicon carbide, low-dielectric constant dielectric material or a combination thereof. The ILD layer 170 includes a single layer or multiple layers. The ILD layer 170 is formed by a suitable technique, such as CVD. A chemical mechanical planarization (CMP) process may be applied to remove excessive ILD layer 170 and expose top surfaces of dummy gate electrodes 134 of the dummy gate structures 130 to a subsequent dummy gate removal process.

Figure 10:
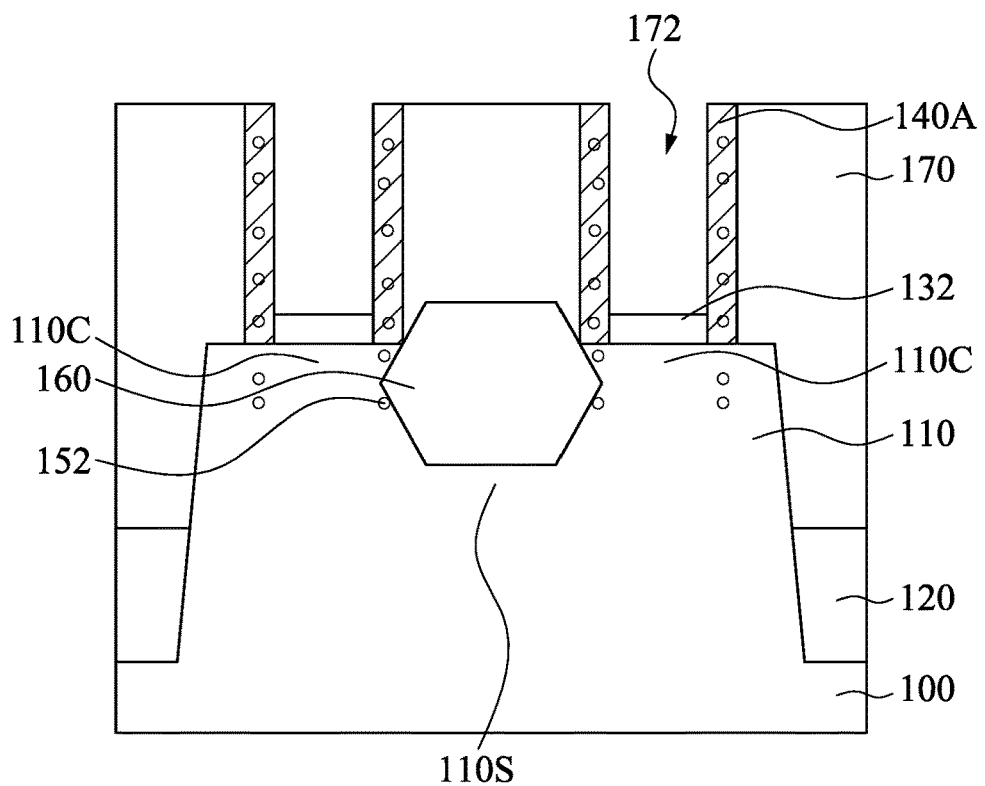

Reference is made to FIG. 10. The remaining dummy gate structures 130 (see FIG. 9) are removed to form gate trenches 172 with the gate spacers 140A as its sidewall. In some embodiments, the gate dielectric layers 132 are removed as well. Alternatively, in some embodiments, the dummy gate electrodes 134 are removed while the gate dielectric layers 132 retain as shown in FIG. 10. The dummy gate structures 130 may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 11:
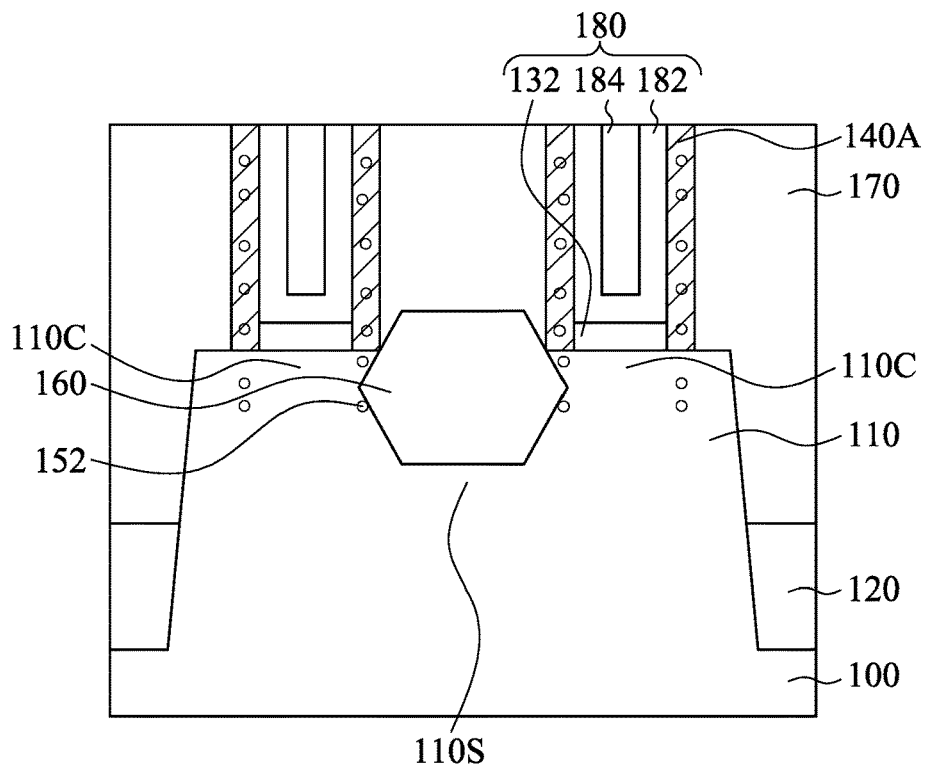

Reference is made to FIG. 11. Work function conductors 182 are formed in the gate trenches 172, and filling conductors 184 are formed in recesses of the work function conductors 182. The filling conductors 184, the work function conductors 182, and the underlying gate dielectric layer 132 can be collectively referred to as gate stacks 180. The gate stacks 180 straddle the semiconductor fin 110 and extend along the gate spacers 140A. The gate spacers 140A are present on sidewalls of the gate stacks 180. In some embodiments, the work function conductors 182 may include work function metals to provide a suitable work function for the gate stacks 180. For example, the work function conductor 182 may include one or more n-type work function metals (N-metal), such as titanium aluminide (TiAl), titanium aluminium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. Alternatively, the work function conductor 182 may include one or more p-type work function metals (P-metal), such as titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the filling conductors 184 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 12:
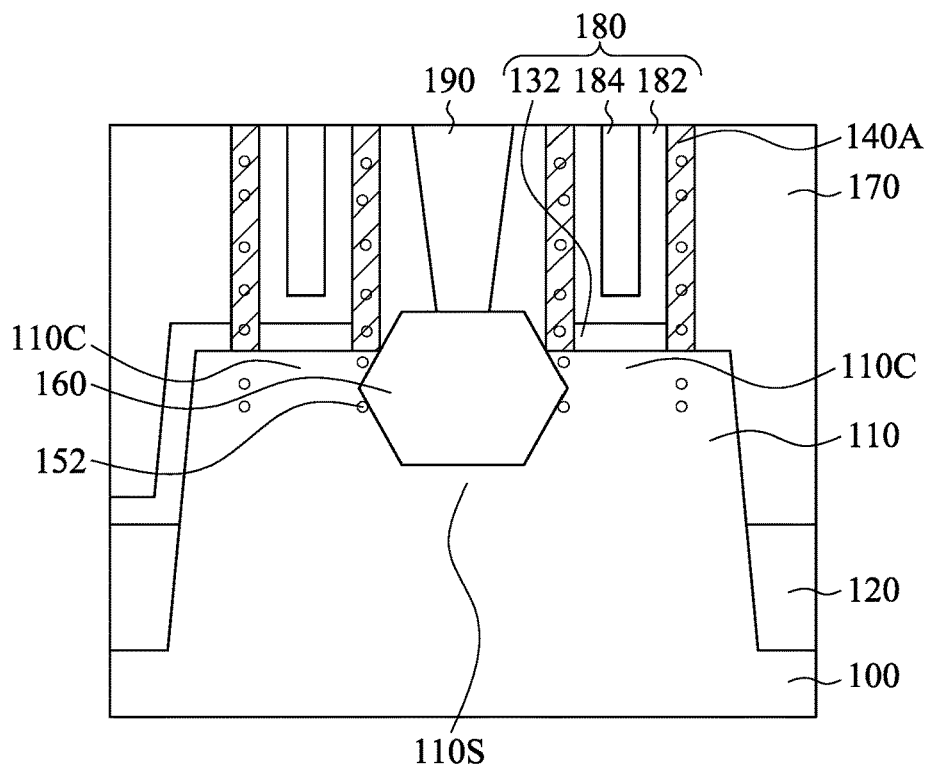

Reference is made to FIG. 12. A conductive feature, such as a contact plug 190, is formed through the ILD layer 170 and in contact with a top of the epitaxy structure 160. The contact plug 190 can thus serve as a source/drain contact. Exemplary formation method of the contact plug 190 may include forming a contact hole by one or more etching processes to sequentially etch through the ILD layer 170 down to the epitaxy structure 200, and depositing metal or other suitable conductive materials in the contact hole by a deposition process, such as a CVD process, to form the contact plug 190.

Figure 13:
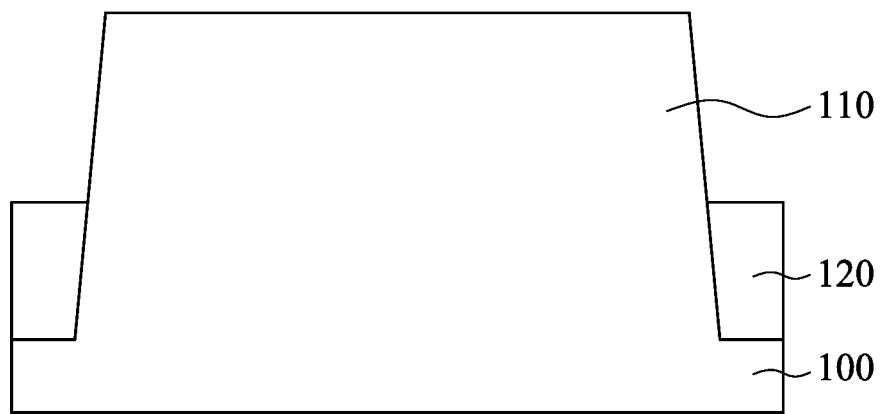
FIG. 13 to FIG. 23 are cross-sectional views of a method for manufacturing a semiconductor device at various stages in accordance with some embodiments of the present disclosure.
Figure 14:
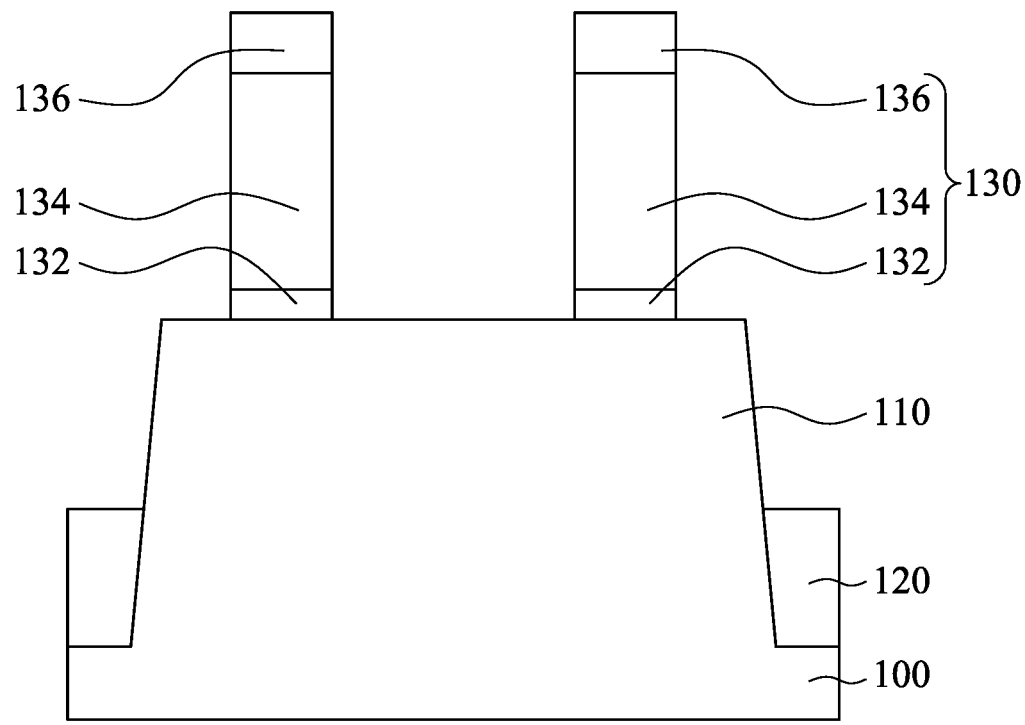
Figure 15:
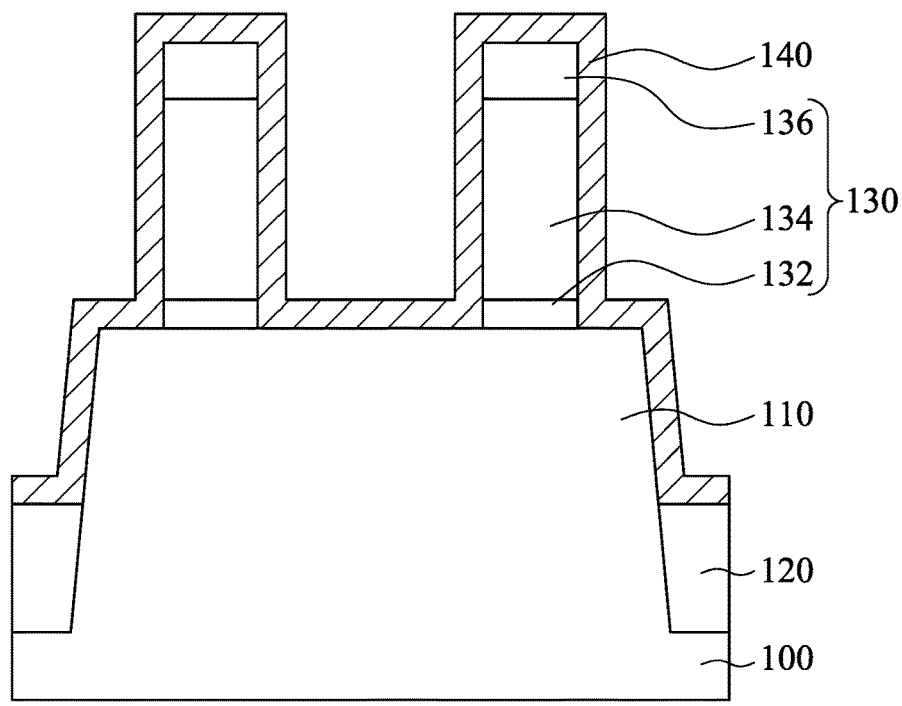

FIG. 13 to FIG. 23 are cross-sectional views of a method for manufacturing a semiconductor device at various stages in accordance with some embodiments of the present disclosure. Reference is made to FIGS. 13-15, as described above with reference to FIGS. 1-3, the semiconductor fin 110, the isolation dielectric 120, the gate structures 130 and the gate spacer layer 140 are formed on the substrate 100. Other relevant details are similar to those of FIGS. 1-3 and thus will not be repeated hereinafter.

Figure 16:
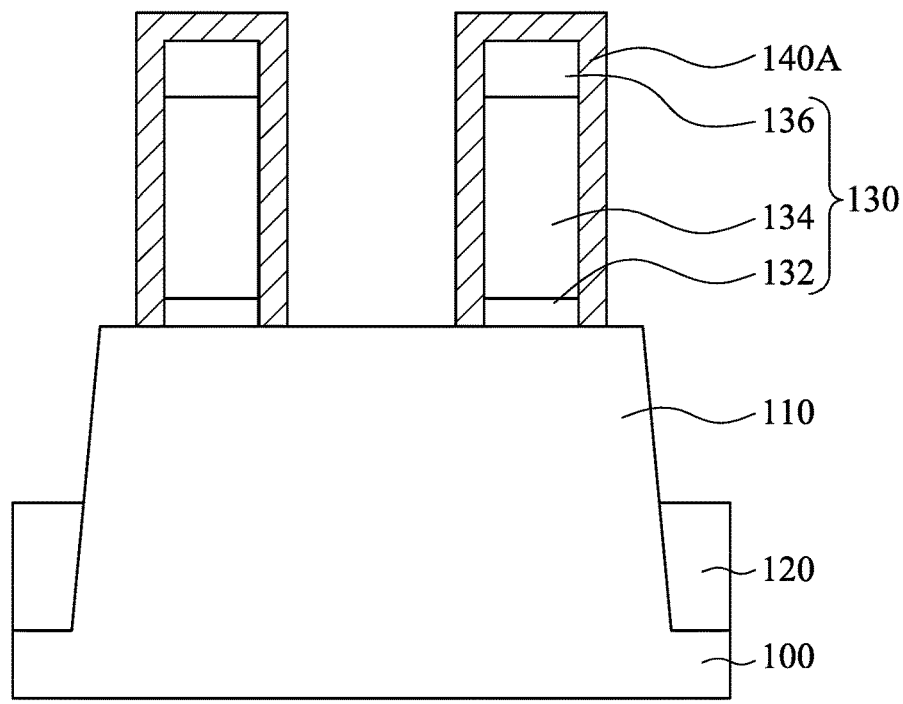

Reference is made to FIG. 16. A removal process may be performed to remove portions of gate spacer layer 140. Remaining portions of the gate spacer layer 140 can serve as gate spacers 140A located on opposite sides of the dummy gate structure 130. The removal process may be, for example, an etching process, such as an anisotropic etching process.

Figure 17:
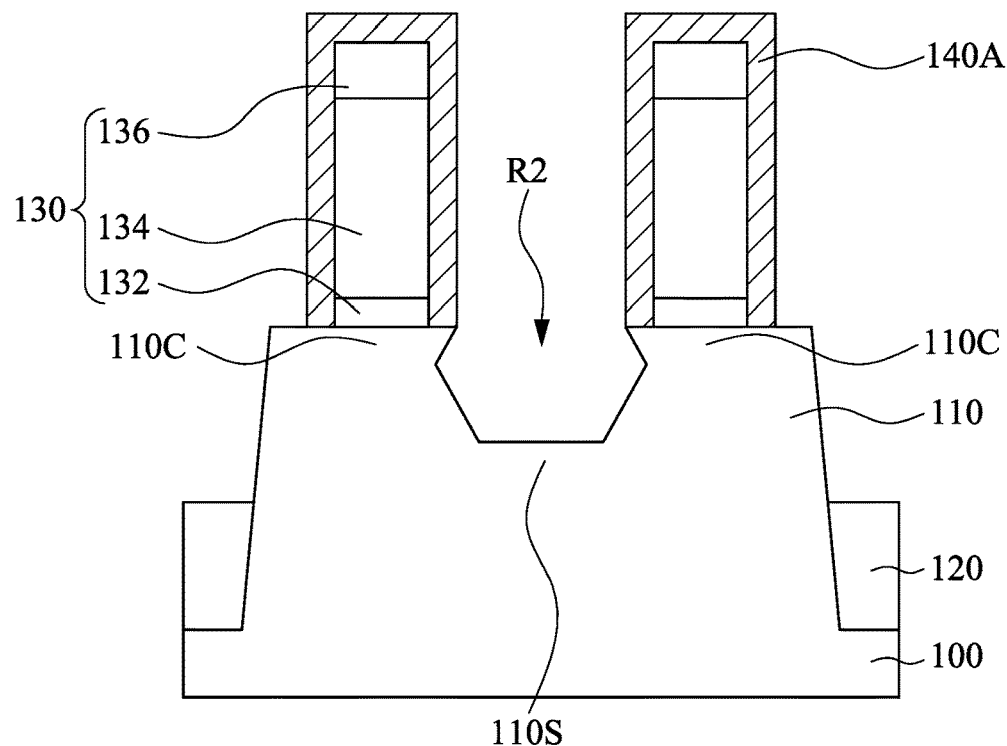

Reference is made to FIG. 17. After the gate spacers 140A are formed, portions of the semiconductor fin 110 exposed by the dummy gate structures 130 and the gate spacers 140A are removed (or recessed) to form a recess R2 in the substrate 100. A remaining portion of the semiconductor fin 110 has at least one source/drain portion 110S and channel portions 110C. The channel portions 110C underlie respect dummy gate structures 130, and the source/drain portion 110S is exposed by the dummy gate structures 130 and the gate spacers 140A. Other relevant details of the recess R2 are similar to the recess R1 in FIG. 5 and thus will not be repeated hereinafter.

Figure 18:
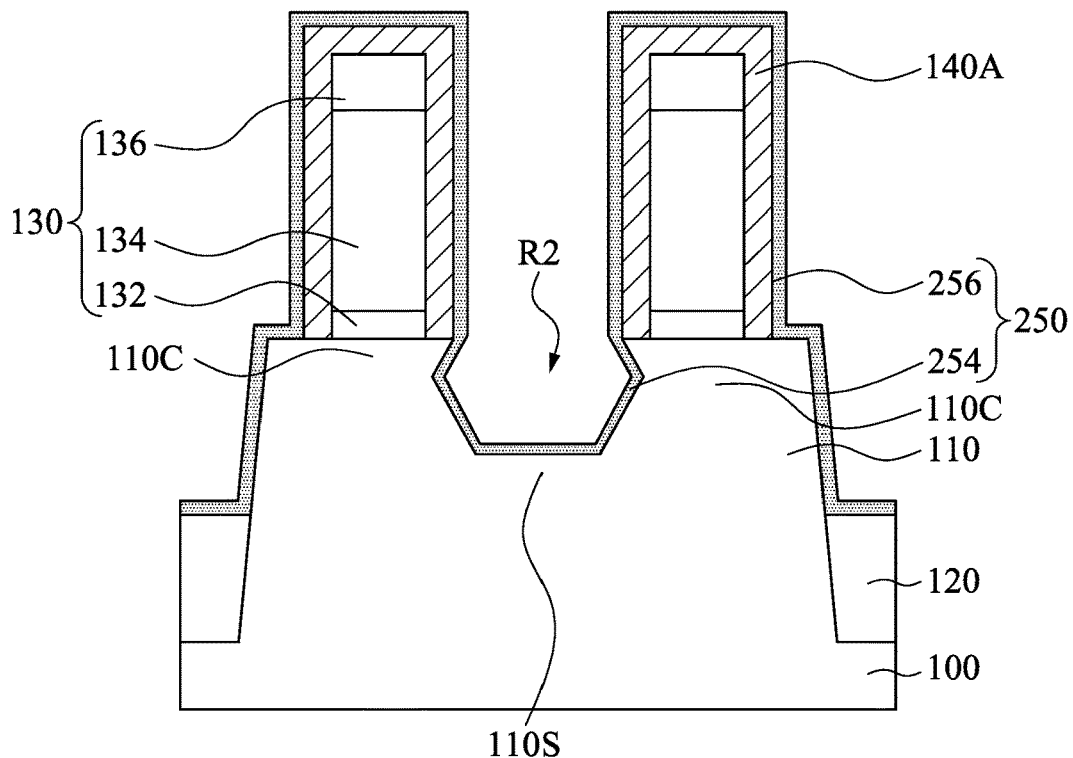

Reference is made to FIG. 18. A dopant-rich layer 250 is conformally formed on the gate spacer layers 140 and in the recess R2 over the substrate 100. More particular, the dopant-rich layer 250 is formed lining the recess R2. In other words, the dopant-rich layer 250 includes a first conformal liner 254 extending into the recess R2 and along surfaces of the recess R2 and a second conformal liner 256 extending along the gate spacers 140A. The first conformal liner 254 has a portion extending to a position below the gate spacers 140A. The first conformal liner 254 may act as a diffusion barrier layer to retard or prevent out-diffusion of a dopant, such as phosphorus or boron, from subsequently formed epitaxy structures, which will be discussed below.

In some embodiments, the dopant-rich layer 250 may include a dopant, such as, carbon. In some embodiments, the dopant-rich layer 250 is formed, by a suitable technique, such as plasma-assisted process or plasma doping (PLAD). Stated differently, a plasma doping (PLAD) process is performed to form a dopant-rich layer 250 on the substrate 100. For example, the pressure of the plasma doping process is in a range from about 5 mTorr to about 50 mTorr. The substrate may be or may not be biased. If the substrate is biased, the dopant depth of the dopant-rich layer 250 can be increased. The dopant-rich layer 250 formed by plasma doping may have a great uniformity at three dimensional structure, since the plasma ions in the plasma sheath may move in different directions, rather just being directed toward the substrate. In alternative embodiments, the dopant-rich layer 250 may be performed by ion beams (ion implantation, or beam line), chemical vapor deposition (CVD), physical vapor deposition (PVD), atomic layer deposition (ALD), sputtering, other suitable processes, or combinations thereof.

Figure 19:
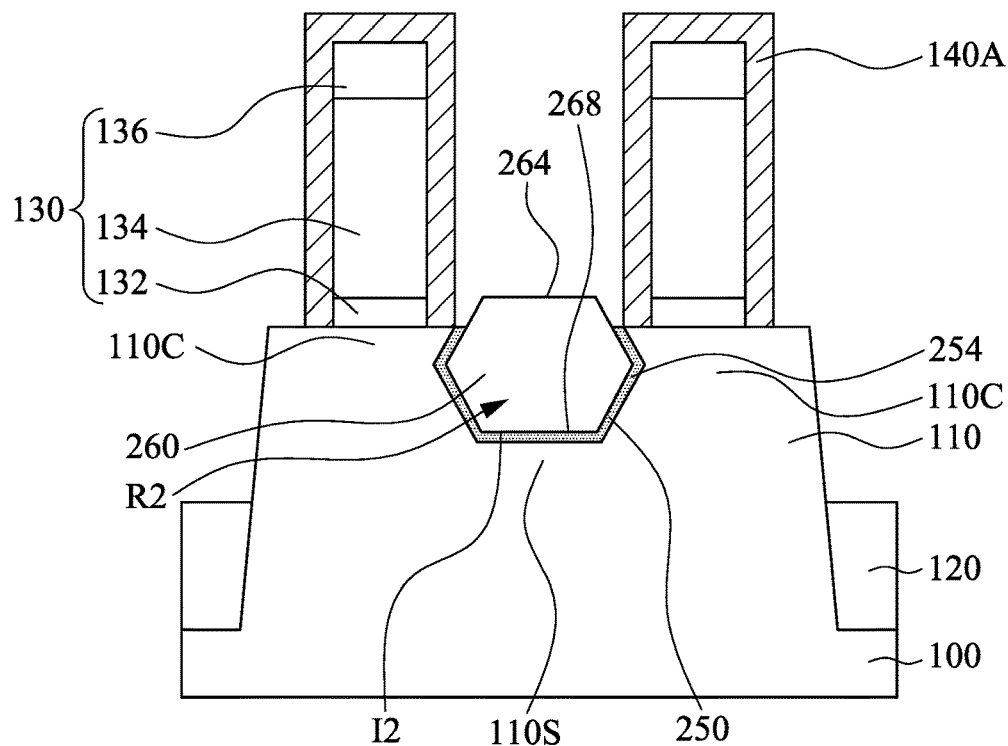
Figure 20:
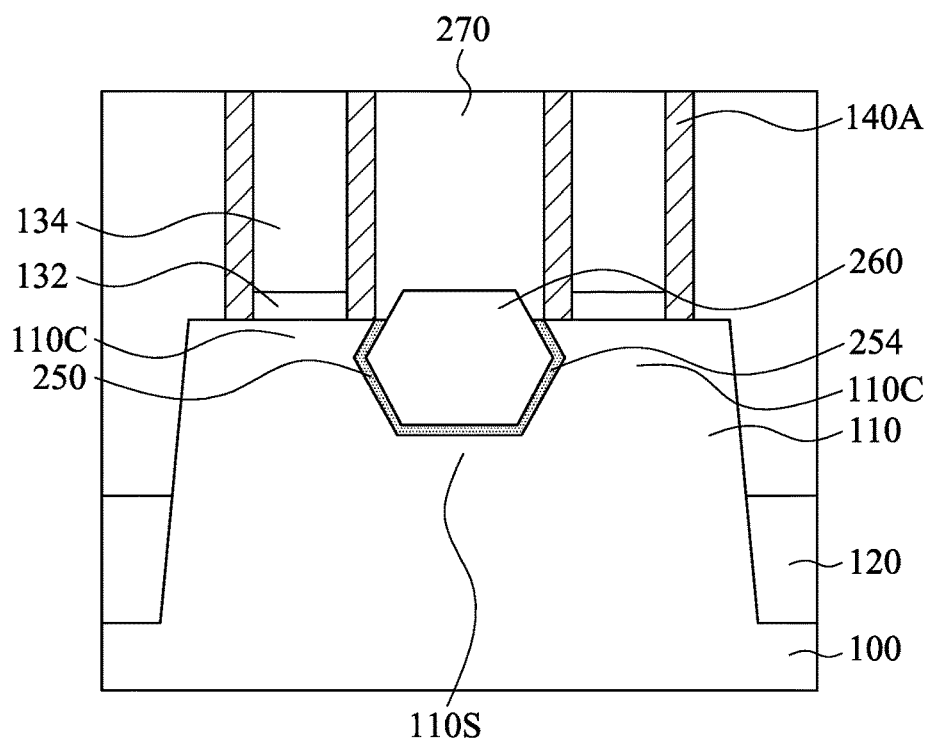
Figure 21:
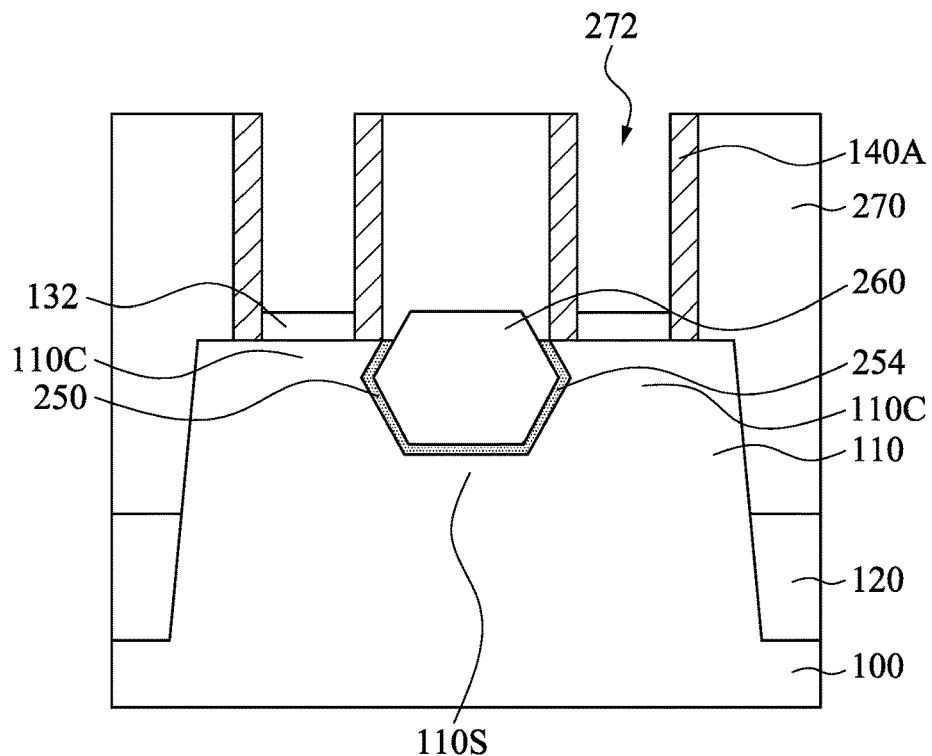
Figure 22:
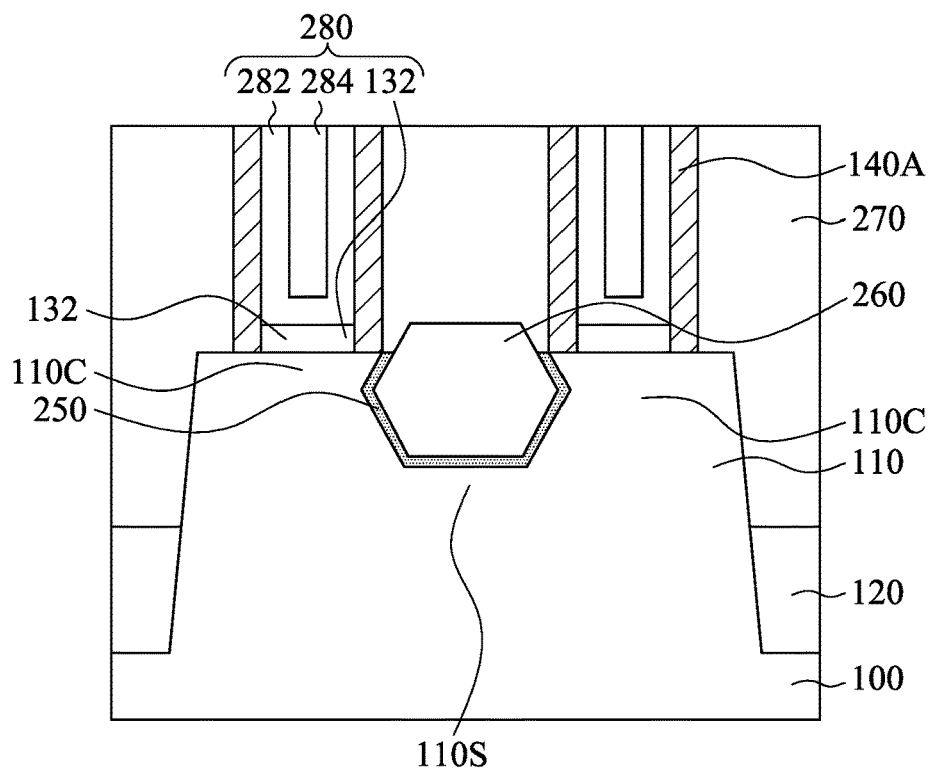
Figure 23:
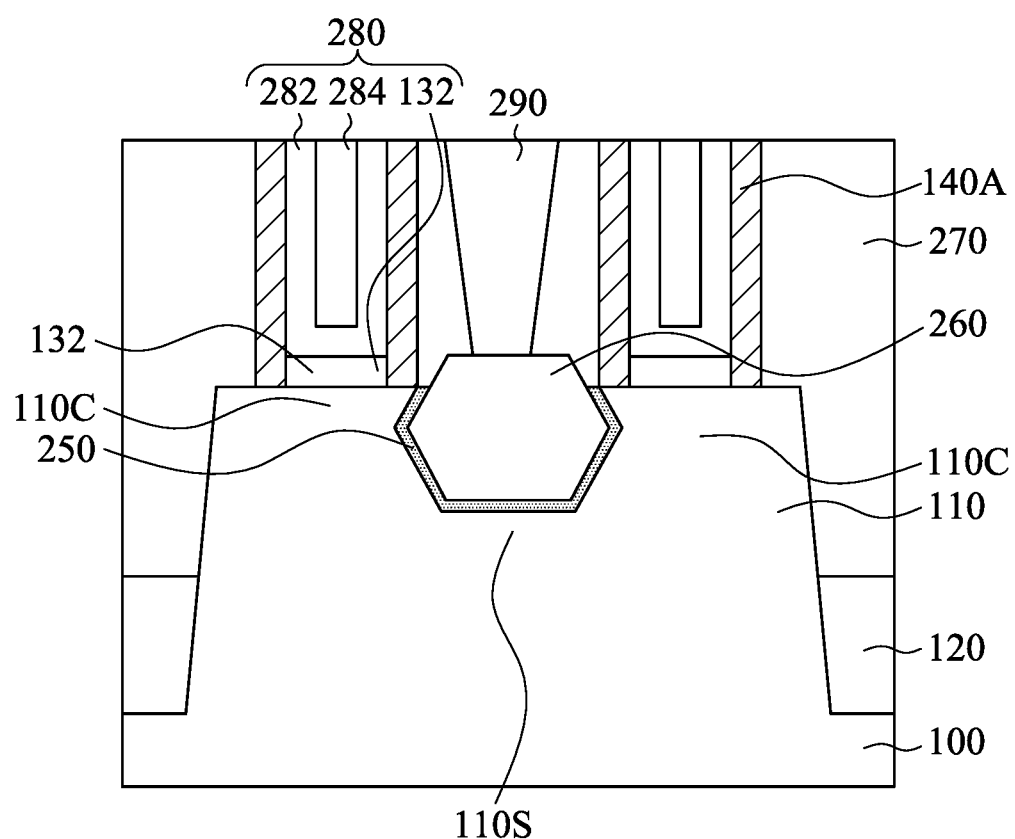

Thereafter, portions of the dopant-rich layer 250 outside the recess R2 can be removed using suitable etch operations, as shown in FIG. 19. For example, the second conformal liner 256 on the gate spacers 140A is removed. Next, an optional annealing process may be performed to drive the carbon dopants of the dopant-rich layer 250 into the substrate 100. The annealing may utilize rapid thermal annealing (RTA), spike annealing, millisecond annealing, and/or laser annealing. Because carbon in the dopant-rich layer 250 and/or in the substrate 100 can retard or prevent out-diffusion of phosphorus from subsequently formed epitaxy structures, the first conformal liner 254 of the dopant-rich layer 250 and/or carbon dopants in the substrate 100 can be referred to as carbon-containing diffusion barriers.

Thereafter, Reference is made to FIG. 19. An epitaxy structure 260 is formed within the recess R2 and on at least one source/drain portion 110S of the semiconductor fin 110. The remaining dopant-rich layer 250 (i.e. the first conformal liner 254) extends along the epitaxy structure 260 and terminates prior to reaching a level height than a top surface 264 of the epitaxy structure 260. In some embodiments, the first conformal liner 254 is between a bottom surface 268 of the epitaxy structure 260 and the substrate 100. In further embodiments, the epitaxy structure 260 is embeddedly retained in a recess or a space defined by the first conformal liner 254. Stated differently, the first conformal liner 254 is a carbon film conformally over the recess R2, and the epitaxy structure 260 fills a space defined by the carbon film. The first conformal liner 254 forms an interface I2 with the epitaxy structure 260. More particularly, the interface I2 formed by the first conformal liner 254 and the epitaxy structure 260 extends to a position below a bottom surface of the gate spacer 140A. Since the epitaxy structure 260 is embedded in the first conformal liner 254, the first conformal liner 254 may retard the out-diffusion of phosphorus from the epitaxy structure 260 into the channel portions 110C. Therefore, phosphorus of the epitaxy structure 260 may be well controlled in the recess R2. Moreover, inhibition of the phosphorus diffusion from the epitaxy structure 160 into the channel portions 110C also reduces a short channel effect, thus improving a performance of the semiconductor device and having favorable DIBL (drain-induced barrier lowering) characteristics. One or more annealing processes may be performed to activate the epitaxy structure 260. The annealing processes include rapid thermal annealing (RTA) and/or laser annealing processes. In some embodiments, a single annealing process can be performed to either diffuse the dopants from the dopant-rich layer 250 into the substrate 100 or activate the epitaxy structure 260. Other relevant details of the epitaxy structure 260 are similar to the epitaxy structure 160 discussed previously and thus will not be repeated hereinafter.

Reference is made to FIGS. 20-23, as described above with reference to FIGS. 7-10, the interlayer dielectric (ILD) layer 270 is formed at outer sides of the gate spacers 140A on the substrate 100, the dummy gate structures 130 are removed to form gate trenches 272 with the gate spacers 140A as its sidewall, the work function conductors 282 and the filling conductors 284 are formed in the gate trenches 272, and a conductive feature, such as a contact plug 290, is formed through the ILD layer 270 and in contact with a top of the epitaxy structure 260. Other relevant details are discussed previously and will not be repeated.

Embodiments of the present disclosure have at least following advantages. Since carbon below the gate spacer is present between the channel portion and at least one source/drain portion, the carbon can retard the out-diffusion of the dopant from the epitaxy structure on the source/drain portion into the channel portion. Such inhibition of the phosphorus diffusion from the epitaxy structure into the channel portion can reduce a short channel effect, thus improving a performance of the semiconductor device and having favorable DIBL (drain-induced barrier lowering) characteristics. Moreover, since phosphorus can be well confined in the epitaxy structure by the carbon-containing diffusion barrier, a capacitance formed between the epitaxy structure and the channel portion can be reduced.

In some embodiments, a method includes forming a gate structure on a substrate; forming a gate spacer on a sidewall of the gate structure; forming a carbon-containing layer on the gate spacer; diffusing carbon from the carbon-containing layer into a portion of the substrate below the gate spacer; forming a recess in the substrate on one side of the gate spacer opposite to the gate structure; and forming an epitaxy feature in the recess of the substrate.

In some embodiments, a method includes forming a gate structure over a substrate; forming a spacer layer over the gate structure; forming a carbon-containing layer over the gate spacer; performing an annealing process to diffuse carbon dopants from the carbon-containing layer into the spacer layer and the substrate, so as to form a first carbon-containing diffusion barrier in the spacer layer and a second carbon-containing diffusion barrier in the substrate, in which the first carbon-containing diffusion barrier is vertically aligned with the second carbon-containing diffusion barrier; and forming an epitaxy structure in the substrate.

In some embodiments, a method includes forming a gate structure on a substrate; forming a gate spacer on a sidewall of the gate structure; forming a carbon-containing layer over the gate spacer; removing the carbon-containing layer; removing a horizontal portion of the gate spacer to expose a surface of the substrate; and forming an epitaxy structure in the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate structure over a substrate;
   forming a spacer layer over the gate structure;
   forming a carbon-containing layer over the spacer layer;
   performing an annealing process to diffuse carbon dopants from the carbon-containing layer into the spacer layer and the substrate, such that a first carbon-containing diffusion barrier is formed in the spacer layer and a second carbon-containing diffusion barrier is formed in the substrate, and the first carbon-containing diffusion barrier is vertically aligned with the second carbon-containing diffusion barrier; and
   forming an epitaxy structure in the substrate.

2. The method of claim 1, further comprising removing the carbon-containing layer after performing the annealing process.

3. The method of claim 1, wherein the spacer layer comprises a horizontal portion over a top surface of the gate structure and vertical portions along sidewalls of the gate structure, and the first carbon-containing diffusion barrier is in the horizontal portion and the vertical portions of the spacer layer.

4. The method of claim 3, wherein a highest level of the first carbon-containing diffusion barrier is higher than the top surface of the gate structure.

5. The method of claim 4, wherein the gate structure comprises a gate dielectric layer, a gate electrode over the gate dielectric layer, and a mask layer over the gate electrode, wherein the highest level of the first carbon-containing diffusion barrier is higher than a top surface of the mask layer.

6. The method of claim 1, further comprising etching the spacer layer to form gate spacers on opposite sidewalls of the gate structure.

7. The method of claim 6, wherein forming the epitaxy structure in the substrate comprises:
   etching an exposed surface of the substrate to form a recess in the substrate; and
   forming an epitaxy material in the substrate.

8. The method of claim 1, wherein the carbon-containing layer is formed using a plasma-assisted process.

9. The method of claim 1, wherein a lowest level of the second carbon-containing diffusion barrier is below an angled corner formed by an up-slant facet and a down-slant facet of the epitaxy structure.

10. A method, comprising:
    forming a gate structure on a substrate;
    forming a gate spacer layer on a sidewall of the gate structure;
    forming a carbon-containing layer on the gate spacer layer;
    diffusing carbon from the carbon-containing layer into a portion of the substrate below the gate spacer layer;
    etching the gate spacer layer to form a gate spacer on the sidewall of the gate structure;
    forming a recess in the substrate on one side of the gate spacer opposite to the gate structure; and
    forming an epitaxy feature in the recess of the substrate.

11. The method of claim 10, wherein the carbon-containing layer is formed using a plasma-assisted process.

12. The method of claim 10, further comprising:
    removing the carbon-containing layer prior to etching the gate spacer layer.

13. The method of claim 10, wherein diffusing the carbon from the carbon-containing layer into the portion of the substrate below the gate spacer layer is performed such that a first carbon-containing diffusion barrier is formed in the gate spacer layer and a second carbon-containing diffusion barrier is formed in the substrate, wherein the first carbon-containing diffusion barrier remains in the gate spacer, and the first carbon-containing diffusion barrier is vertically aligned with the second carbon-containing diffusion barrier.

14. A method, comprising:
    forming a gate structure on a substrate;
    forming a gate spacer layer on a sidewall of the gate structure;
    forming a carbon-containing layer over the gate spacer layer;
    performing an annealing process, such that a first carbon-containing diffusion barrier is formed in the gate spacer layer and a second carbon-containing diffusion barrier is formed in the substrate, and the first carbon-containing diffusion barrier is vertically aligned with the second carbon-containing diffusion barrier;
    removing the carbon-containing layer after performing the annealing process;
    removing a horizontal portion of the gate spacer layer to form a gate spacer on the sidewall of the gate structure, wherein a surface of the substrate is exposed by the gate spacer; and
    forming an epitaxy structure in the substrate.

15. The method of claim 14, wherein a lowest level of the second carbon-containing diffusion barrier is below an angular corner formed by an up-slant facet and a down-slant facet of the epitaxy structure.

16. The method of claim 14, wherein the carbon-containing layer is formed using a plasma-assisted process.

17. The method of claim 14, wherein the carbon-containing layer is formed over a top surface of the gate structure.

18. The method of claim 14, further comprising forming an interlayer dielectric layer over the epitaxy structure.

19. The method of claim 14, further comprising etching the substrate to form a recess in the substrate, wherein the epitaxy structure is formed in the recess of the substrate.

20. The method of claim 14, wherein the gate spacer layer is formed over a top surface of the gate structure.

* * * * *